United States Patent
Kim et al.

(10) Patent No.: US 6,503,789 B1
(45) Date of Patent: Jan. 7, 2003

(54) CONTACT STRUCTURE FOR A SEMICONDUCTOR DEVICE AND MANUFACTURING METHOD THEREOF

(75) Inventors: Hong Ki Kim, Seoul (KR); Duck Hyung Lee, Yongin (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/610,293

(22) Filed: Jul. 5, 2000

(30) Foreign Application Priority Data

Jul. 8, 1999 (KR) ........................................ 99-0027380

(51) Int. Cl.[7] ......................................... H01L 21/8238
(52) U.S. Cl. ....................... 438/232; 438/199; 438/231; 438/305; 438/306; 438/527
(58) Field of Search ................................ 438/199, 231, 438/232, 305, 306, 527, 942

(56) References Cited

U.S. PATENT DOCUMENTS

| | | | |
|---|---|---|---|
| 5,534,461 A | 7/1996 | Kuwajima | 437/189 |
| 5,847,444 A | 12/1998 | Yamazaki | 257/635 |
| 6,008,093 A | * 12/1999 | Aoki et al. | 438/276 |
| 6,300,178 B1 | * 10/2001 | Sunouchi | 439/199 |

OTHER PUBLICATIONS

Wolf, S. and Tauber, R.N., "Silicon Processing for the VLSI Era", vol. 1, pp. 183–185, 1986.*

* cited by examiner

Primary Examiner—Stephen D. Meier
Assistant Examiner—Christy Novacek
(74) Attorney, Agent, or Firm—Lee & Sterba, P.C.

(57) ABSTRACT

A semiconductor contact structure for a merged dynamic random access memory and a logic circuit (MDL) and a method of manufacturing the contact structure to: (i) a cell contact pad; (ii) at least one active region; and (iii) at least one gate electrode simulaneously, whereby an electric short between the gate electrodes and the cell contact pad is avoided, even in the event a lithographic misalignment occurs and whereby it is possible to obtain an overlap margin in the cell region, even with an improved metal contact to the gate electrode in the peripheral circuit region of the semiconductor device.

14 Claims, 4 Drawing Sheets

CONTACT STRUCTURE FOR A SEMICONDUCTOR DEVICE AND MANUFACTURING METHOD THEREOF

BACKGROUND OF THE INVENTION

1. Field of the Invention

The present invention relates generally to a contact structure and to a method of making an electric contact to a conductive layer during the manufacture of an integrated circuit. More particularly, the invention relates to a method of fabricating a contact during the manufacture of a merged dynamic random access memory (DRAM) and a logic circuit (the merged device being referred to as MDL).

2. Description of Related Art

Self-aligned contacts (SAC) for cell pads recently have become widely employed for making bit line contacts in DRAMs because the contact size has now been reduced to sub-half-micrometer levels. This has been due primarily to reduced design rules used to manufacture such devices. The prior art typically employed a method of forming a gate spacer by depositing a silicon nitride layer of about 1500 to 2000 Å on the gate electrode in order to obtain a shoulder between the cell contact pad and the gate electrode. It is well known in the prior art that this shoulder should preferably be more than 400 Å. It is difficult, however, to apply such prior art teachings to the manufacture of a high-density DRAM or of an MDL chip.

The reason for this difficulty is the following. In the case of an MDL chip, it is desirable to form metal contacts on the gate electrodes of peripheral logic circuits simultaneously with the contact pads of the bit lines in the memory cell regions. It is further necessary, in this case, to remove the silicon nitride capping layer from the gate electrode in order to make the metal contact for the peripheral logic circuits, while at the same time maintaining an overlap margin between the cell contact pad and the bit line contact in the memory cell regions.

The details of the herein described technical problems of the prior art can be explained by reference to FIGS. 1 and 2. FIG. 1 is a schematic diagram illustrating a contact structure fabricated in a DRAM cell, and in a peripheral circuit or logic region, according to the prior art.

Referring now to FIG. 1, electrical connections are made to the conducting layer 114 through contacts 115, 116, and 117 on the contact pad 121 of the cell region and on the active region 111 and gate electrode 112 of the peripheral region, respectively. According to the prior art, an oxide flow is usually employed for forming an interlayer dielectric 113 and a gate electrode typically includes a stacked structure comprised of a doped polysilicon layer 118, a tungsten silicide layer 112, and a silicon nitride layer 119.

In FIG. 1, it can be seen that the vertical depth of the hole for contact 115 for the contact pad 121 in the cell region is different from the depth of the hole for 116 for the active region of the peripheral circuit. In addition, it can be seen that the depth of the hole for contact 117 for the gate electrode 112 also differs from the depth of the hole for contact 115 for the cell contact pad 121. Accordingly, one can not rule out the possibility that the surface of the active region 111 may be damaged due to excessive etching that may occur during the process of forming holes for contacts 115, 116, and 117.

Furthermore, the silicon nitride capping layer 119 should be etched after the removal of interlayer dielectric 113 when forming contact hole 117 on the gate electrode 112. This is especially important in the peripheral or logic circuit region of the integrated circuit. Therefore, any slight lithographic misalignment that may, inevitably, occur in defming contact hole 115 may result in an electric shortage between the gate tungsten silicide 131 and the active region 110 in the cell region (see, FIG. 2). The electric path of the above shortage is through contact pad 121 and contact hole 115.

FIG. 2 is a schematic diagram illustrating this electric shortage problem that may occur due to lithographic misalignment according to the prior art. The electric shortage between the gate electrode 131 (usually comprised of tungsten silicide) and the contact pad 121 via contact hole 115 in the cell region is frequently observed because the contact hole 115 in the cell region is formed simultaneously with contact hole 117 in the peripheral circuits. The electric shortage problem between the gate electrode 131 and the cell contact pad 121 occurs even more frequently when the minimum contact size is reduced to the order of a sub-half-micrometer, as is usually found in recent highly integrated circuits.

SUMMARY OF THE INVENTION

Accordingly, there exists a need to develop a contact and a method of making the contact that allows an overlap margin between the contact hole and the cell contact pad, even if lithographic misalignment occurs during manufacturing. There also exists a need to develop a contact and a method of making the contact that provides an improved metal contact on the gate electrode having a gate-capping layer.

It is therefore a feature of the present invention to satisfy these needs by providing a contact and a method of making the contact that allows an overlap margin between the contact hole and the cell contact pad, even during lithographic misalignment. It is an additional feature of the invention to provide a contact and a method of making the contact that provides improved metal contact on a gate electrode having a gate-capping layer.

In accordance with these and other features readily apparent to those skilled in the art, there is provided a semiconductor device having a cell region and a peripheral region, each region containing at least an active region, where the device includes: a first conductivity type field effect transistor (FET) that does not have a thermal oxide layer on a surface of an active region in the peripheral region; and a second conductivity type FET that contains a thermal oxide layer on a surface of an active region in the peripheral region.

In accordance with an additional feature of the invention, there is provided a method of making a semiconductor device comprising: providing a substrate that includes at least a cell region and a peripheral or logic region, each region having active and gate regions where the gate regions are to contain at least one gate structure; forming a plurality of gate structures on the substrate, each of the plurality of gate structures comprising at least a gate-capping layer and an oxide layer; forming a first mask layer, exposing said first mask layer in the peripheral region of the substrate, active and gate regions of a first conductivity type FET, and at least one gate region of a second conductivity type FET; implanting a first conductivity type impurity on the substrate covered with the first mask layer; removing the first mask layer; forming a second mask layer, and exposing said second mask layer in the peripheral region of the substrate, active and gate regions of a second conductivity type FET, and a gate region of a first conductivity type FET; implanting a second conductivity type impurity on the substrate covered with the second mask layer; and removing the gate-capping layer from the plurality of gate structures in the peripheral region.

It is an additional feature of the present invention to provide a method of making a semiconductor integrated circuit having a first circuit region and a second circuit region comprising: providing a substrate having at least a first circuit region and a second circuit region, each of the first and second circuit regions having active and gate regions, where the gate regions are to contain at least one gate structure; forming a plurality of gate structures in the first and second circuit regions, the gate structures comprising at least a gate-capping layer; forming a silicon oxide layer on the substrate including the plurality of gate structures for subsequent ion implantation; forming a first mask layer on the substrate; patterning the first mask layer to expose at least one gate structure of the first circuit region and at least one active region of a first conductivity type FET in the first circuit region; implanting impurities of a first conductivity type on the exposed surface of the substrate through the patterned first mask layer; eliminating the silicon oxide layer on the surface of the substrate; removing the first mask layer; forming a second mask layer; patterning the second mask layer to expose at least one gate structure of the first circuit region and at least one active region of a second conductivity type FET of the first circuit region; implanting impurities of a second conductivity type on the exposed surface of the substrate through the patterned second mask layer; eliminating the gate-capping layer on the gate structures in the first circuit region; removing the second mask layer; forming an interlayer dielectric film on the substrate; and forming contacts by exposing the surface of at least one active region of the first circuit region, the surface of at least one gate region of the first circuit region, and the surface of at least one active region of the second circuit region.

Further features and advantages of the present invention will become apparent to those skilled in the art from a review of a description of the fabrication process, and the semiconductor device resulting therefrom, taken in conjunction with the accompanying drawings of the preferred embodiments of the invention. The preferred embodiments and accompanying drawings, however, should not be taken to limit the invention, but are for explanation and understanding only.

DETAILED DESCRIPTION OF PREFERRED EMBODIMENTS

Figure 1:
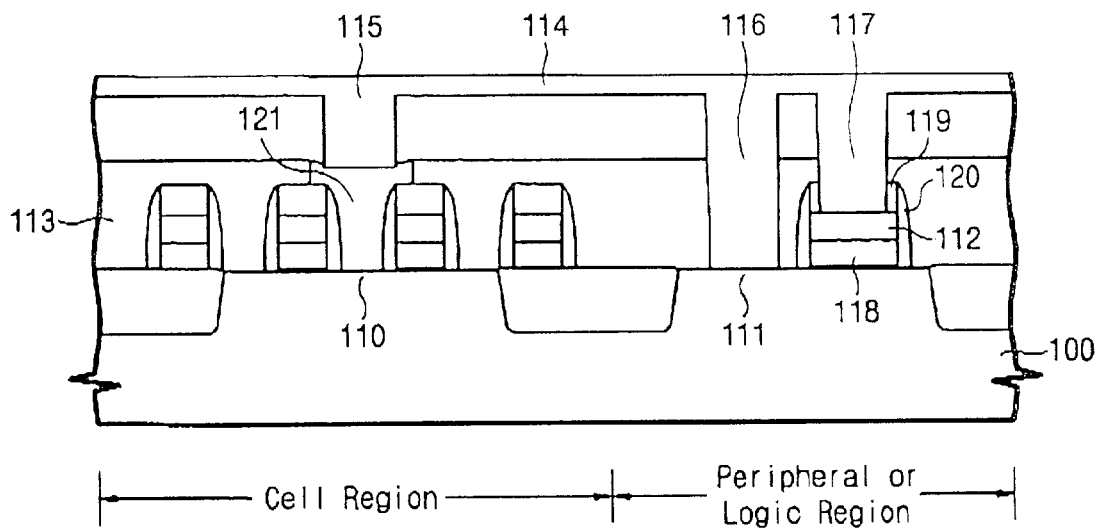
FIG. 1 is a schematic cross-sectional view of a semiconductor device illustrating contact holes formed in the cell and peripheral regions in accordance with the prior art.
Figure 2:
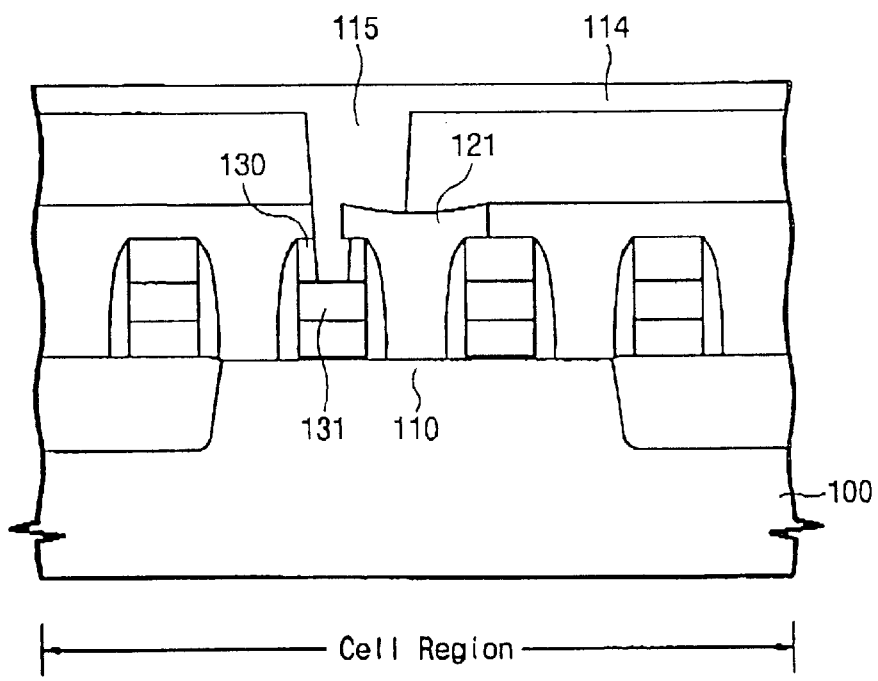
FIG. 2 is a schematic cross-sectional view of a semiconductor device illustrating an electric shortage between the gate electrode and the cell contact pad due to lithography misalignment in accordance with the prior art.

Korean patent application No. 1999-0027380, filed on Jul. 8, 1999, and entitled: "Contact Structure for a Semiconductor Device and Manufacturing Method Thereof," is incorporated herein by reference in its entirety.

The present invention provides a semiconductor device having a cell region and a peripheral region, each region containing at least an active region, where the device includes:

a first conductivity type field effect transistor (FET), preferably an n-channel metal oxide semiconductor transistor (NMOS), that does not have a thermal oxide layer on a surface of an active region in the peripheral region; and a second conductivity type FET, preferably a p-channel metal oxide semiconductor transistor (PMOS), having a thermal oxide layer on a surface of an active region in the peripheral region.

The present invention provides a method of making a semiconductor device comprising:

providing a substrate that includes at least a cell region and a peripheral or logic region, each region having active and gate regions where the gate regions are to contain at least one gate structure;

forming a plurality of gate structures on the substrate, each of the plurality of gate structures comprising at least a gate-capping layer and an oxide layer;

forming a first mask layer, exposing said first mask layer in the peripheral region of the substrate, active and gate regions of a first conductivity type FET (or NMOS) and at least one gate region of a second conductivity type FET (or PMOS);

implanting a first conductivity type impurity on the substrate covered with the first mask layer;

removing the first mask layer;

forming a second mask layer, exposing said second mask layer in the peripheral region of the substrate, active and gate regions of a second conductivity type FET, and a gate region of a first conductivity type FET;

implanting a second conductivity type impurity on the substrate covered with the second mask layer; and removing the gate-apping layer from the plurality of gate structures in the peripheral region.

It is preferred in the invention to form the plurality of gate structures by the following process:

forming a gate oxide layer on the substrate;

forming a polysilicon layer, preferably a doped polysilicon layer, on the gate oxide layer;

forming a silicide layer on the polysilicon layer;

forming a first silicon nitride layer on the silicide layer;

etching the resulting structure on the substrate according to a gate mask pattern;

forming a second silicon nitride gate spacer; and forming a gate spacer by anisotropically etching the second silicon nitride gate spacer layer.

When forming the plurality of gate structures, a silicon oxide layer may be formed on the first silicon nitride layer, and, preferably, the silicon oxide layer is a high temperature oxide (HTO) layer having a thickness within the range of about 300 to about 800 Å. It also is preferred in the process to form the gate spacer by anisotropically etching the second silicon nitride gate spacer layer to thereby expose (the optional silicon oxide layer or) the first silicon nitride layer.

A silicon oxide layer also may be formed on the surface of the substrate. In this embodiment of the invention, the silicon oxide layer preferably is a medium temperature oxide (MTO) layer having a thickness within the range of from about 50 to about 300 Å.

Removing the gate-capping layers comprises, preferably, removing a silicon nitride layer that is disposed on a silicide layer. Removing the gate-capping layers also comprises, preferably:

removing the second mask layer;

forming an interlayer dielectric film on the substrate; and patterning the interlayer dielectric film thereby forming contact holes to: (i) a cell contact pad in the cell region; (ii) at least one active region in the peripheral or logic circuit region; and (iii) at least one gate electrode in the peripheral or logic circuit region.

Another preferred embodiment of the present invention provides a method of making a semiconductor integrated circuit having a first circuit region and a second circuit region comprising:

providing a substrate having at least a first circuit region and a second circuit region, each of the first and second circuit regions having active and gate regions, where the gate regions are to contain at least one gate structure;

forming a plurality of gate structures in the first and second circuit regions, the gate structures comprising at least a gate-capping layer;

forming a silicon oxide layer on the substrate including the plurality of gate structures for subsequent ion implantation;

forming a first mask layer on the substrate;

patterning the first mask layer to expose at least one gate structure of the first circuit region and at least one active region of a first conductivity type FET in the first circuit region;

implanting impurities of a first conductivity type on the exposed surface of the substrate through the patterned first mask layer;

eliminating the silicon oxide layer on the surface of the substrate;

removing the first mask layer;

forming a second mask layer;

patterning the second mask layer to expose at least one gate structure of the first circuit region and at least one active region of a second conductivity type FET of the first circuit region;

implanting impurities of a second conductivity type on the exposed surface of the substrate through the patterned second mask layer;

eliminating the gate-capping layer on the gate structures in the first circuit region;

removing the second mask layer;

forming an interlayer dielectric film on the substrate; and forming contacts by opening the surface of at least one active region of the first circuit region, the surface of at least one gate region of the first circuit region, and the surface of at least one active region of the second circuit region.

In this embodiment, the first circuit region comprises, preferably, a peripheral circuit or a logic region in a semiconductor integrated circuit and the second circuit region comprises a memory cell region in a semiconductor integrated circuit.

It is preferred that the gate-capping layer is a silicon nitride ($Si_3N_4$) layer and/or a stacked layer of silicon nitride and silicon oxide ($Si_3N_4/SiO_2$). The gate structure preferably has sidewalls and comprises a silicon nitride gate spacer on the sidewalls. It also is preferred that the second circuit region comprise a contact pad that electrically connects the active region formed between said gate structures.

When forming the silicon oxide layer, it is preferred that the silicon oxide layer is a high temperature oxide (HTO) layer or a medium temperature oxide (MTO) layer having a thickness within the range of from about 50 to about 300 Å.

The plurality of gate structures are, preferably, formed by:

forming a gate oxide layer on the substrate;

forming a polysilicon layer, preferably a doped polysilicon layer on the gate oxide layer;

forming a silicide layer on the polysilicon layer;

forming a first silicon nitride layer on the silicide layer;

etching the resulting structure on the substrate according to a gate mask pattern;

forming a second silicon nitride gate spacer layer on the patterned gate structure; and forming a gate spacer by anisotropically etching the second silicon nitride gate spacer layer.

It is also preferred in the invention to form the contacts by forming a contact hole to a cell contact pad that electrically connects to an active region of the second circuit region and is self-aligned to the gate structures of the second circuit region.

In the present invention, the method of making the semiconductor provides, preferably, a metal contact to the conducting layers in the peripheral circuits, as well as a bit line contact to the cell pad. The present invention, therefore, eliminates the possible electric shortage that may occur between the gate and the cell pad, even in the event of lithographic misalignment.

The present invention will now be explained in further detail by reference to the accompanying drawings.

Figure 3:
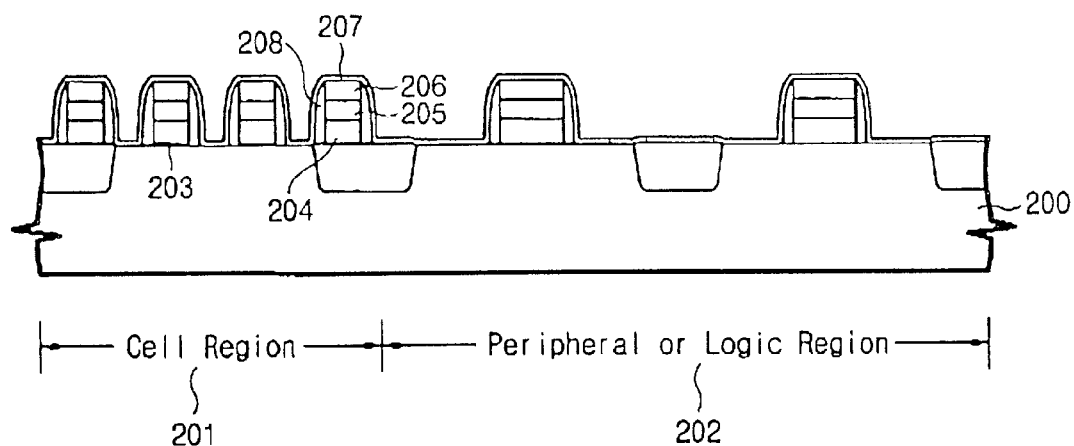
FIGS. 3 to 7 are schematic cross-sectional views illustrating the method of making a semiconductor device in accordance with the present invention.

FIGS. 3 to 7 are schematic cross-sectional views illustrating a method of making a semiconductor device in accordance with the present invention. In the figures, like reference numerals denote like embodiments. Referring to FIG. 3, several gate structures are formed on the substrate 200.

The left half of FIGS. 3 through 7 represents the cell region 201 while the right half represents the peripheral, or the logic circuit region. The gate structures are to comprised, preferably, of a gate oxide layer 203, a polysilicon layer 204, a silicide layer 205, a silicon nitride layer 206, and a silicon nitride gate spacer 208. Those skilled in the art appreciate that the particular construction and chemical make-up of the respective layers of the gate structures are not limited to the preferred components discussed above, but that other suitable arrangements may be made in accordance with the present invention.

As a preferred embodiment in accordance with the present invention, the thickness of the silicon nitride layer 206 can be within the range of about 1500 to 2500 Å.

Thereafter, gate spacer 208 can be formed by first forming a silicon nitride layer over the surface of the patterned gate structure and then anisotropically etching the silicon nitride layer. Referring to FIG. 3, the top layer of the gate structure is, preferably, a silicon nitride layer 206, and the sidewalls of the patterned gate structure are covered with silicon nitride 208. As a result, the gate structure in accordance with the present invention includes a gate electrode comprising, preferably, a doped polysilicon layer 204, silicide layer 205, a gate-capping layer comprising a silicon nitride layer 206 and a silicon nitride gate spacer 208 formed on the sidewalls thereof.

Then, a silicon oxide layer 207 is preferably formed on the substrate including the plurality of gate structures. Preferably, the silicon oxide layer 207 is formed by a MTO or a HTO process, and hence, can be referred to as a MTO layer or a HTO layer, and has a thickness within the range of about 50 to 300 Å.

Figure 4:
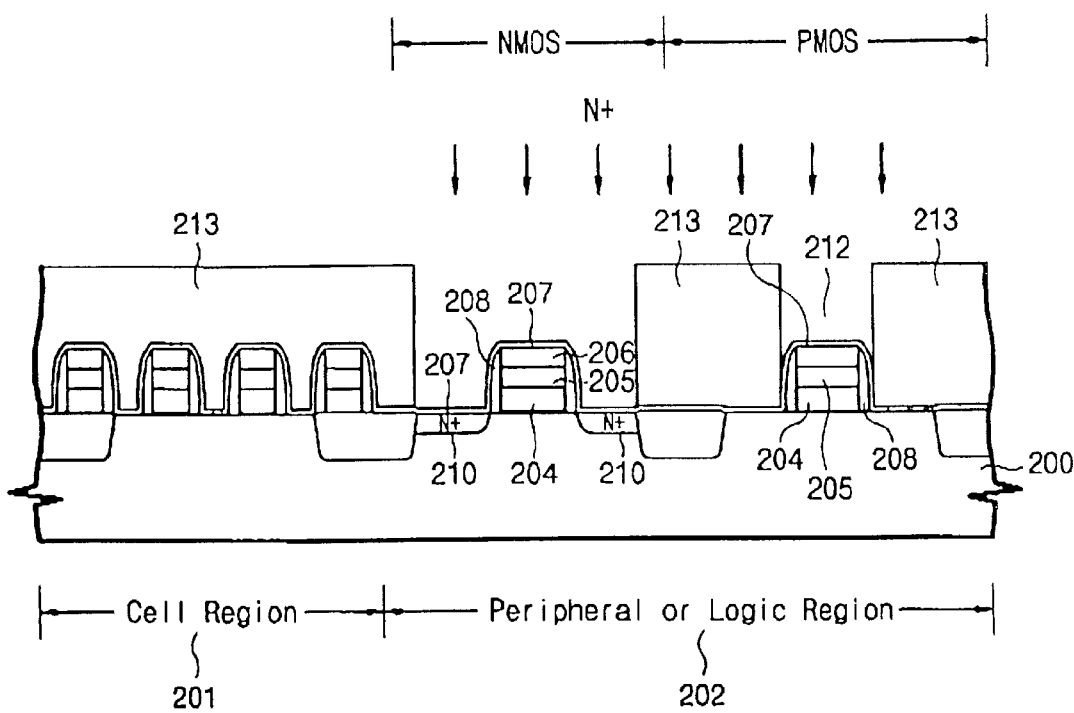

Thereafter, a NMOS device, also referred to as a first conductivity type FET, can be formed for implementing the peripheral or the logic circuit region 202. Referring to FIG. 4, the entire surface of the cell region 201 is covered with a photoresist layer 213, while at least one gate region 211, as well as at least one active region 210 for a NMOS device are exposed. In addition, at least one gate region 212 of a PMOS, also referred to as a second conductivity type FET, is exposed. The exposed gate regions 211 and 212, and the active region 210 in the peripheral or logic circuit regions 202 are then implanted with N-type impurities. Preferably, the silicon oxide layer 207 works as a pad oxide for an ion implantation.

Once the N-type ion implantation is performed, the silicon oxide layer 207 is removed from the exposed surfaces of the gate structures and from exposed surfaces of active region 210. Thereafter, the photoresist layer can be removed and another mask layer formed for subsequent processing steps. Skilled artisans are capable of using suitable techniques to form the respective layers, active regions and gate regions, as well as forming suitable photoresist layers, using the appropriate masks, and removing selected portions of the semiconductor device, using techniques known in the art, along with the guidelines provided herein.

Figure 5:
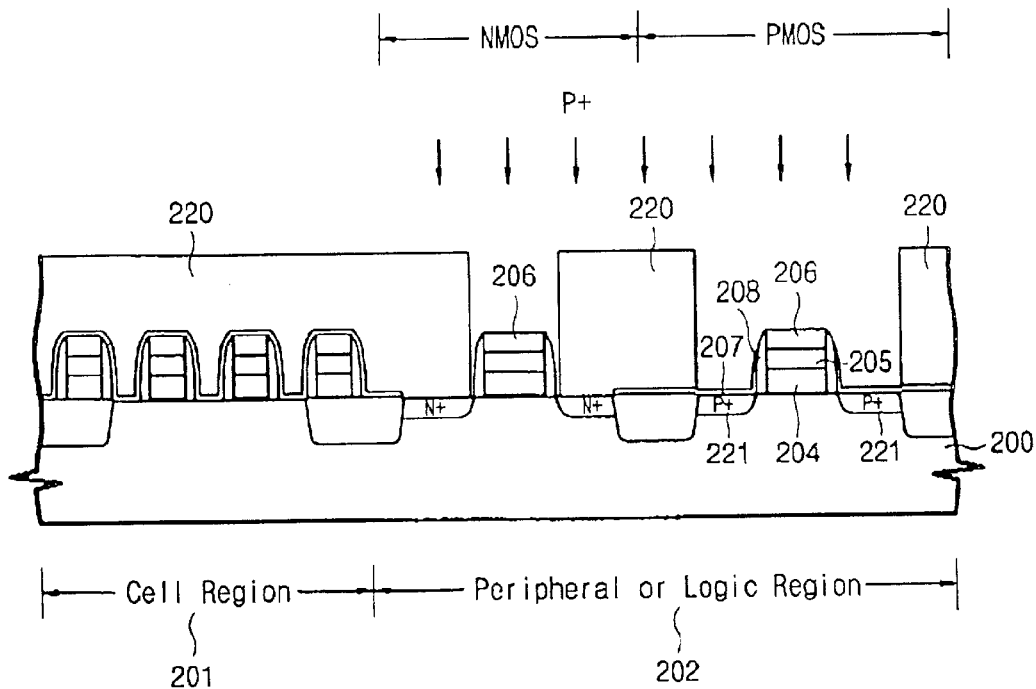

FIG. 5 is a schematic cross-sectional view illustrating one of the processing sequences for fabricating a PMOS device in the peripheral or logic circuit region 202. Referring now to FIG. 5, the fabricated devices in the cell region 201 are protected with a photoresist layer 220.

In a preferred embodiment of the present invention, at least one gate region, including silicon nitride layer 206 of a NMOS device, as well as at least one gate region including silicon nitride layer 206, and at least one active region 221 for a PMOS device, are exposed and subjected to ion implantation of P-type impurities. Thereafter, the silicon oxide layer 207 may be removed from the surface of the active region 221 of the PMOS device. Then, preferably, the silicon nitride layer 206 on the gate of a PMOS device is anisotropically etched as well.

Figure 6:
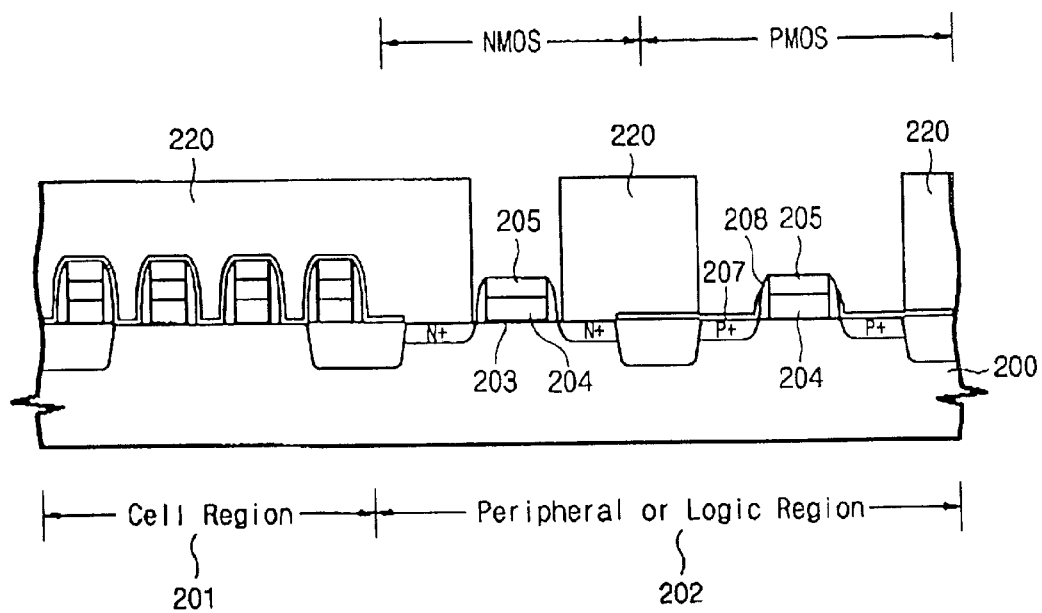

FIG. 6 is a schematic cross-sectional view illustrating a semiconductor device after eliminating the silicon nitride layer 206 from the gate electrode. A contact can then be formed after the mask layer 220 is removed.

Figure 7:
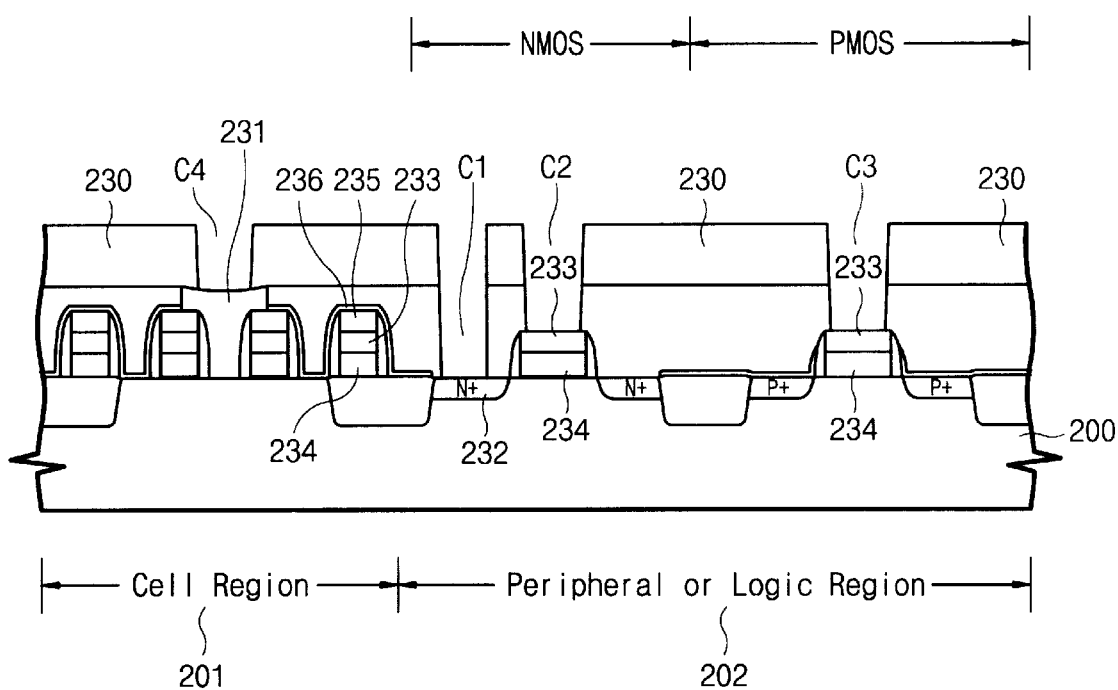

Referring now to FIG. 7, a self-aligned contact (SAC) pad 231 is formed in the cell region 201 while contacts C1–C3 are formed all the way to the active region 232, and to the gate structures 233, respectively. It should be noted that the gate structures for the peripheral or logic region circuits 202 now comprise a silicide layer 233 (previously layer 205) and the polysilicon layer 234 (previously layer 204) because the gate-capping layer (e.g., silicon nitride layer 206) has been eliminated.

On the other hand, the gate structures in the cell region 201 include, in addition to the silicide layer 233 and polysilicon layer 234, a silicon nitride layer 235 and a silicon oxide layer 236. Since the silicon nitride layer 206 on the gate structure in the peripheral region 202 has already been removed according to the preferred embodiment of the present invention described above (see, FIG. 6), an improved metal contact can be made on the top of the gate structures in the peripheral or logic circuit region 202.

Furthermore, it becomes possible to obtain an overlap margin even in the event that a lithographic misalignment occurs, if the etching selectivity with respect to the silicon nitride layers can be controlled. In other words, the bit line contact C4 to the cell pad 231 can be formed by selectivity etching the interlayer dielectric 230 with respect to the silicon nitride layer 235 remaining on the gate electrodes. Therefore, it becomes possible to avoid an electric shortage between the cell pad and the gate electrodes, even in the case of lithography misalignment.

Although the invention has been illustrated and described with respect to exemplary and preferred embodiments thereof, those skilled in the art will appreciate that various other modifications, omissions, and additions may be made to the invention without departing from the spirit and scope thereof. Therefore, the present invention should not be understood as limited to the specific embodiments set forth above, but is understood to include all possible embodiments which can be included within the scope encompassed by (and equivalents thereof) the appended claims.

What is claimed is:

1. A method of making a semiconductor device comprising:

providing a substrate comprising at least a cell region and a peripheral region, each region having active and gate regions;

forming a plurality of gate structures on the substrate, each of the plurality of gate structures comprising at least a gate-capping layer and a gate oxide layer;

forming a silicon oxide layer on the substrate including the plurality of gate structures;

forming a first mask layer, exposing said first mask layer in the peripheral region of the substrate, active and gate regions of a first conductivity type field effect transistor (FET), and at least one gate region of a second conductivity type FET;

implanting a first conductivity type impurity on the substrate covered with the first mask layer;

eliminating the silicon oxide layer from areas exposed by the first mask pattern in the peripheral region, the silicon oxide layer remaining in the cell region;

removing the first mask layer;

forming a second mask layer, exposing said second mask layer in the peripheral region of the substrate, active and gate regions of a second conductivity type FET, and a gate region of a first conductivity type FET;

implanting a second conductivity type impurity on the substrate covered with the second mask layer; and removing the gate-capping layer from the plurality of gate structures in the peripheral region.

2. The method as claimed in claim 1, wherein forming a plurality of gate structures comprises:

forming a gate oxide layer on the substrate;

forming a polysilicon layer on the gate oxide layer;

forming a silicide layer on the polysilicon layer;

forming a first silicon nitride layer on the silicide layer;

etching the resulting structure on the substrate according to a gate mask pattern;

forming a second silicon nitride gate spacer layer on the patterned gate structure; and forming a gate spacer by anisotropically etching the second silicon nitride gate spacer layer.

3. The method as claimed in claim 1, wherein removing the gate-capping layer comprises removing a silicon nitride layer that is disposed on a silicide layer.

4. The method as claimed in claim 1, wherein removing the gate capping layers further comprises:

removing the second mask layer;

forming an interlayer dielectric film on the substrate; and patterning the interlayer dielectric film thereby forming contact holes to: (i) a cell contact pad in the cell region;

(ii) at least one active region in the peripheral region; and (iii) at least one gate electrode in the peripheral region.

5. A method of making a semiconductor integrated circuit having a first circuit region and a second circuit region comprising:

providing a substrate comprising at least a first circuit region and a second circuit region, each of the first and second circuit regions having active and gate regions;

forming a plurality of gate structures in the first and second circuit regions, the gate structures comprising at least a gate-capping layer;

forming a silicon oxide layer on the substrate including the plurality of gate structures;

forming a first mask layer on the substrate;

patterning the first mask layer to form a first mask pattern and to expose at least one gate structure of the first circuit region and at least one active region of a first conductivity type FET in the first circuit region;

implanting impurities of a first conductivity type on the exposed surface of the substrate through the patterned first mask layer;

eliminating the silicon oxide layer from areas exposed by the first mask pattern in the first circuit region, the silicon oxide layer remaining in the second circuit region;

removing the first mask pattern;

forming a second mask layer on the substrate after removing the first mask pattern;

patterning the second mask layer to form a second mask pattern and to expose at least one gate structure of the first circuit region and at least one active region of a second conductivity type FET of the first circuit region;

implanting impurities of a second conductivity type on the exposed surface of the substrate through the patterned second mask layer;

eliminating the gate-capping layer on the gate structures in the first circuit region;

removing the second mask pattern;

forming an interlayer dielectric film on the substrate after removing the second mask pattern; and forming contacts by exposing the surface of at least one active region of the first circuit region, the surface of at least one gate region of the first circuit region, and the surface of at least one active region of the second circuit region.

6. The method as claimed in claim 5, wherein the first circuit region comprises a peripheral circuit or a logic region in a semiconductor integrated circuit.

7. The method as claimed in claim 5, wherein the second circuit region comprises a memory cell region in a semiconductor integrated circuit.

8. The method as claimed in claim 5, wherein the gate-capping layer is a silicon nitride ($Si_3N_4$) layer.

9. The method as claimed in claim 5, wherein the plurality of gate structures have sidewalls and comprise a silicon nitride gate spacer on the sidewalls.

10. The method as claimed in claim 5, wherein the second circuit region comprises a contact pad that electrically connects an active region formed between gate structures.

11. The method as claimed in claim 2, wherein the silicon oxide on the first silicon nitride layer is a high temperature oxide (HTO) layer having a thickness within the range of about 50 to 300 Å.

12. The method as claimed in claim 5, wherein the silicon oxide layer comprises a medium temperature oxide (MTO) layer having a thickness within the range of about 50 to about 300 Å.

13. The method as claimed in claim 5, wherein forming the plurality of gate structures comprises:

forming a gate oxide layer on the substrate;

forming a polysilicon layer on the gate oxide layer;

forming a silicide layer on the polysilicon layer;

forming a first silicon nitride layer on the silicide layer;

etching the resulting structure on the substrate according to a gate mask pattern;

forming a second silicon nitride gate spacer layer on the patterned gate structure; and forming a gate spacer by anisotropically etching the second silicon nitride gate spacer layer.

14. The method as claimed in claim 9, wherein forming the contacts by exposing the surfaces comprises forming a contact hole to a cell contact pad that electrically connects to an active region of the second circuit region and is self-aligned with the gate structures of the second circuit region.

* * * * *